(12) United States Patent
Iwamasa et al.

(10) Patent No.: US 7,464,365 B2
(45) Date of Patent: Dec. 9, 2008

(54) METHOD AND COMPUTER PROGRAM PRODUCT FOR OPERATING A SPECIFICATION OF A SYSTEM

(75) Inventors: Mikito Iwamasa, Tokyo (JP); Tadatoshi Ishii, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 610 days.

(21) Appl. No.: 10/059,227

(22) Filed: Jan. 31, 2002

(65) Prior Publication Data

US 2004/0015826 A1 Jan. 22, 2004

(30) Foreign Application Priority Data

Jan. 31, 2001 (JP) .............. 2001-024478

(51) Int. Cl.
*G06F 9/44* (2006.01)
(52) U.S. Cl. ............... 717/100; 717/104; 717/120; 718/102
(58) Field of Classification Search ............ 717/100, 717/104, 120–123; 718/102–108
See application file for complete search history.

(56) References Cited

U.S. PATENT DOCUMENTS

| | | | | |
|---|---|---|---|---|
| 4,800,521 | A * | 1/1989 | Carter et al. ............... | 718/102 |
| 5,598,559 | A * | 1/1997 | Chaudhuri ................ | 707/2 |
| 5,758,032 | A * | 5/1998 | Sanders .................... | 706/45 |
| 5,874,955 | A * | 2/1999 | Rogowitz et al. ......... | 345/589 |
| 6,021,266 | A * | 2/2000 | Kay ........................... | 716/2 |
| 6,023,583 | A * | 2/2000 | Honda ....................... | 717/158 |
| 6,152,612 | A * | 11/2000 | Liao et al. ................. | 703/23 |
| 6,266,764 | B1 * | 7/2001 | Okamoto .................. | 712/206 |
| 6,490,545 | B1 * | 12/2002 | Peng ......................... | 703/13 |
| 6,651,163 | B1 * | 11/2003 | Kranich et al. ........... | 712/244 |
| 6,980,941 | B2 * | 12/2005 | Iwamasa .................. | 703/13 |
| 7,051,317 | B2 * | 5/2006 | Vazquez et al. .......... | 717/104 |
| 2007/0006231 | A1 * | 1/2007 | Wang et al. .............. | 718/100 |

OTHER PUBLICATIONS

A software/hardware co-design methodology for embedded microprocessor core design□□"A software/hardware co-design methodology for embedded microprocessor core design" Yong Zhang et al.; IEEE Transactions, vol. 45, Iss.4, Nov. 1999 pp. 1241-1246□□.*
Helaihel, Olukotun "Java as a Specification Language for Hardware-Software Systems" Nov. 1997 ICCAD'97.*

(Continued)

*Primary Examiner*—Lewis A. Bullock, Jr.
*Assistant Examiner*—Jason Mitchell
(74) *Attorney, Agent, or Firm*—Oblon, Spivak, McClelland, Maier & Neustadt, P.C.

(57) ABSTRACT

A movability determining section checks the movability of an descriptive element comprised in a specification having a hierarchical structure. The descriptive element of which the movability is checked is moved in the hierarchical structure by a specification moving section. For the movement, a preparation is made as follows. The specification moving section, if necessary, moves a communication channel included in the descriptive element to make sure that a constraint with respect to the level to which the communication channel belongs is satisfied after the movement. After the preparation, the specification moving section moves a behavior included in the descriptive element upward/downward across levels in the hierarchical structure. A specification correcting section corrects the specification so as not to violate an execution order constraint.

15 Claims, 5 Drawing Sheets

OTHER PUBLICATIONS

Knapp, MacMillen, Miller "Behavioral Synthesis Methodology for HDL-Based Specification and Validation" 1995 ACM.*

IEEE "The Authoritative Dictionary of IEEE Standards and Terms", p. 504.*

El-Ghazawi et al. "UPC Language Specifications V1.0" Feb. 2001 pp. 1-40.*

Lea "A Java Fork/Join Framework" 2000, ACM 2000 conference of Java Grande, pp. 36-43.*

Akito Kadota, et al., "Proposition of Method of Making Program Including Loop Difficult to Read", IEICE Journal (Information/System I-Computer), The Institute Of Electronics, Information and Communication Engineers, Jul. 25, 1997, vol. J80-D-I, No. 7, pp. 644 to 652.

Araki D. Ishii, et al., "Rapid Prototyping with HW/SW codesign tool", Engineering of Computer-Based Systems, Proceedings. ECBS '99. IEEE Conference and Workshop on Mar. 1999, pp. 114-121.

J. Zhu, et al., "Syntax and Semantics of the SpecC Language", In Proceedings on the Seventh Workshop on Synthesis and System Integration of Mixed Technologies, Dec. 1997.

* cited by examiner

{e, end_a, end_b, end_c, end_abc, flg, par {ABC(e, end_a, end_b, end_c, end_abc, flg),
                                              D (end_a, end_b, end_c, end_abc, flg) } }
ABC (e, end_a, end_b, end_c, end_abc, flg) = {fsm {A (e, end_a, flg),
                                                     B (e, end_b, flg)
                                                     C (e, end_b, flg) } }

A (e, end_a, flg) = {try (a) trap (e) {flg = 1, notify (end_a) } }
B (e, end_a, flg) = {try (a) trap (e) {flg = 1, notify (end_a) } }
C (e, end_a, flg) = {try (a) trap (e) {flg = 1, notify (end_a) } }
D (end_a, end_b, end_c, end_abc, flg) = {fsm {wait (end_a, end_b, end_c, end_abc),
                                              flg == 0 : fsm {d} } }

METHOD AND COMPUTER PROGRAM PRODUCT FOR OPERATING A SPECIFICATION OF A SYSTEM

CROSS-REFERENCE TO RELATED APPLICATIONS

This application is based upon and claims the benefit of priority from the prior Japanese Patent Application No. 2001-024478, filed Jan. 31, 2001, the entire contents of which are incorporated herein by reference.

BACKGROUND OF THE INVENTION

1. Field of the Invention

The present invention relates to a specification operating method and computer product for operating specifications in designing hardware, software, and a system including both of them in a computer or electronic information device.

2. Description of the Related Art

Conventionally, the structure or format of a specification is fixed in advance for each design analysis method, and systems are analyzed and designed with suitable different structures in accordance with different targets and purposes. According to an object-oriented software design methodology typified by UML, although a unified format for design is defined, analysis/design methods to be actually used differ for the respective domains, and the structures of specifications and the respective format elements differ in meaning. Therefore, design resources cannot be mutually used for the respective domains. Note that UML is described in detail in, for example, Hans-Eriksson/Magnus Penker, "UML Guidebook", complied/translated by Norio Sugimoto, Osamu Ochiai, and Tamiko Takeda, ISBN4-8101-8987-2.

Assume that a specification needs to be changed because of a change in external environment. In this case, even if the specification is partly corrected, its effective range cannot be estimated. For this reason, the specification must be remade from the beginning. This applies to a design/development process for a single product. For example, when a specification for a prototype is to be created for one product by using the rapid prototyping technique, the specification must be remade in detailed design in accordance with implementation constraints. For example, in a rapid prototyping tool (Rapid), C-language codes are created from a created prototype. However, the codes are not optimized for embedment, and hence must be remade. Note that Rapid is described in detail in, for example, "Rapid-plus, White Paper", http://www.e-sim.com/pdf/whtpaper.pdf as a reference for Rapid.

For example, in remaking a specification for an embedment system constituted by a combination hardware (LSI) and software which serve as an overall system, the specification created for the overall system is remade as independent specifications for hardware and software, respectively, after assignment of hardware and software roles are determined.

Recently, system-level specification description languages independent of hardware and software have been developed. This has improved an environment under which specification description can be performed in the same specification format so as to segment a system-level specification into specifications for software and hardware. Design methodologies have been proposed with the development of these languages. Although these methodologies indicate a process of deriving design specifications for software and hardware from a system-level specification in a top-down manner, external requests cannot cover specification operation for changing the structure of the specification while maintaining the contents of the specification in response to a specification change request due to a change in resource constraint.

According to language compilers for software and language conversion tools typified by gcc, the format of a given specification can be converted into the format of another specification. In this case, specifications having the same contents and same structure are only converted into different formats. That is, every time a specification is changed, the format must be converted into a corresponding one. Note that gcc is described in detail in, for example, "GNU's not Unix", http//www.gnu.org/.

As described above, there is no mechanism of facilitating a change in structure in accordance with external requirements such as a resource constraint, performance, and reliability while holding the contents of the specification. In addition, in automating a change in specification, since there are infinite number of combinations of the internal specifications of specifications depending on the target and fields, it is impossible to create commands corresponding to all specification changes in advance.

BRIEF SUMMARY OF THE INVENTION

The present invention has been made in consideration of the above situation, and has as its object to provide a specification operating method and computer program product which can easily change, in designing a specification, the structure of the specification while holding its contents in accordance with a purpose, resource constraint, external request, or the like.

According to one aspect of the present invention, there is provided a method for operating a specification of a system, comprising: storing a structure of the specification described in a system description language; storing constraint information indicating a first execution order constraint associated with the specification; and processing of converting the specification to another specification having a second execution order constraint equivalent to the first execution order constraint or having a third execution order constraint stronger than the first execution order constraint by referring to the constraint information.

DETAILED DESCRIPTION OF THE INVENTION

An embodiment of the present invention will be described below with reference to the views of the accompanying drawing.

Figure 6:
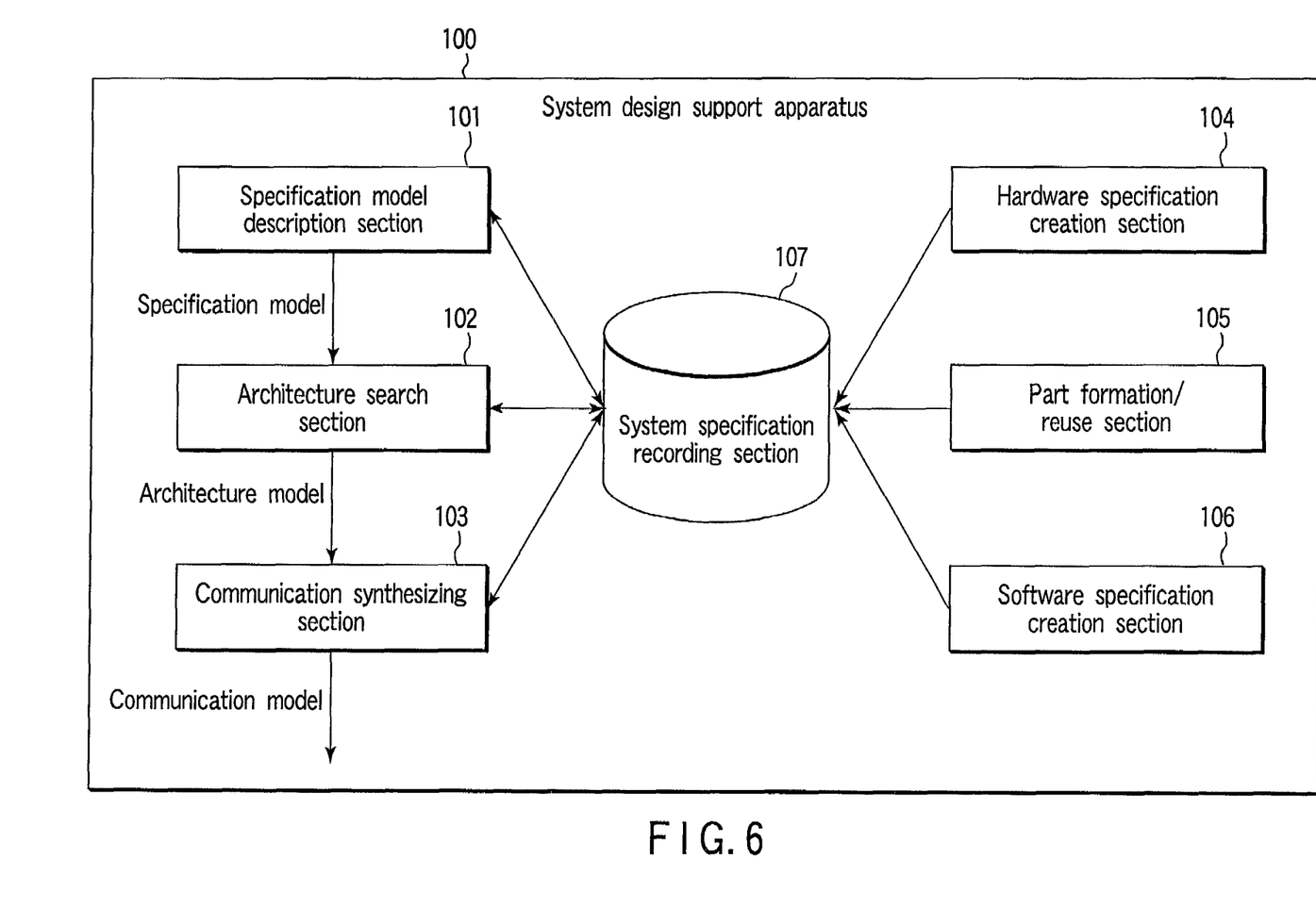
FIG. 6 is a view showing an example of a system design support apparatus.

A system design support apparatus 100 shown in FIG. 6 is comprised of a specification model description section 101, system specification recording section 107, architecture search section 102, communication synthesizing section 103, hardware specification creation section 104, part formation/reuse section 105, and software specification creation section 106.

The system design support apparatus 100 of this embodiment handles at system level, e.g., a specification for software executed by a computer, a specification for hardware combined with semiconductor devices and the like, a specification for an incorporated system constituted by a combination of software and hardware, and a specification for a business process such as a work flow.

The specification model description section 101, which is used to design a specification model comprised of specifications for calculation and communication in such specifications at system level, is a section for supporting a designer to describe specifications. When the designer describes specifications for calculation contents and communication contents according to a predetermined specification description form, a specification description model is created. This specification description model includes a specification structure to be described later. Examples of the specification description form are a structured text form represented by a structured programming language, a structural chart form using graphs, and a table form using tables.

The architecture search section 102 divides a partial structure of a supplied specification description model into elements and distributing the elements to architecture elements while maintaining the contents of the specification in consideration of an architecture (the arrangement of a hardware/software implementation environment). More specifically, parts (the constituent elements of a specification description model) constituting specifications for calculation contents and communication contents designed by the specification model description section 101 are assigned to architecture elements (creation of an architecture model).

The communication synthesizing section 103 synthesizes communication procedures between specification elements on an architecture. More specifically, the communication synthesizing section 103 inserts a communication procedure (protocol) between communication specification elements distributed by the architecture search section 102 and performs protocol conversion (rearrangement of a communication procedure) to match with a communication procedure in which the communication content specification is inserted (creation of a communication model).

The system specification recording section 107 associates the specification model created by the specification model description section 101, the architecture model created by the architecture search section 102, and the communication model created by the communication synthesizing section 103 with each other, and records the resultant data as a system specification.

The hardware specification creation section 104 creates a hardware specification from the system specification recorded on the system specification recording section 107. The software specification creation section 106 creates a software specification from the system specification recorded on the system specification recording section 107.

The part formation/reuse section 105 forms the system specification recorded on the system specification recording section 107 into parts and provides them for reuse in design processes in the specification model description section 101, architecture search section 102, and communication synthesizing section 103.

The specification operating apparatus according to an embodiment of the present invention described bellow is used in architecture search section 102 of system design support system shown in FIG. 6. The specification operating apparatus converts a structure of the specification while keeping the contents of the specification unchanged. The specification operating apparatus makes it possible to segment the specification.

Figure 1:
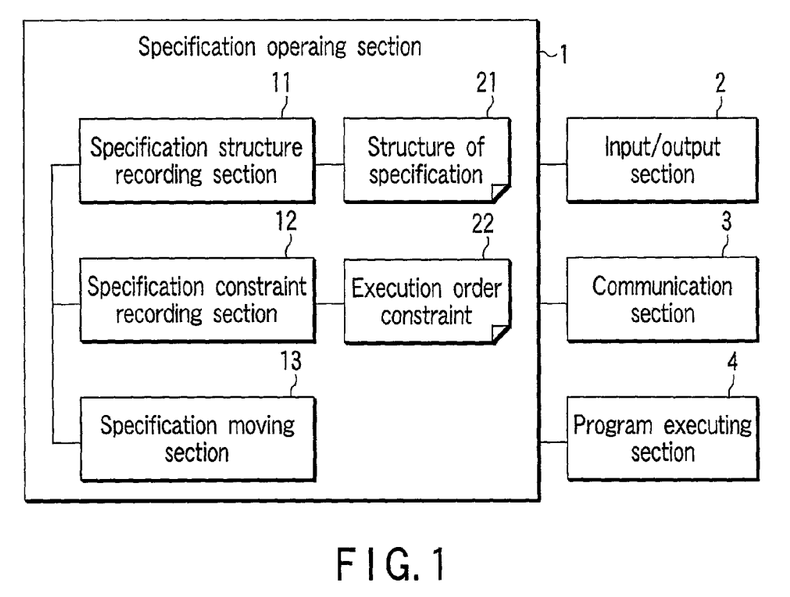
FIG. 1 is a block diagram showing an arrangement of a specification operating apparatus according to an embodiment of the present invention.

FIG. 1 shows an arrangement of a specification operating apparatus according to an embodiment of the present invention.

As shown in FIG. 1, this specification operating apparatus is comprised of a specification operating section 1 including a specification structure recording section 11, a specification constraint recording section 12, and a specification moving section 13, an input/output section 2 which exchanges data and instructions with external units, and a storage section (not shown) for storing necessary data such as specification movement rules (a movability determination rule, movability portion calculation rule, and specification correction rule). This apparatus may further include a communication section 3, program executing section 4, and the like, as needed.

The specification structure recording section 11 records/stores information associated with a specification as structure information 21 including the correlations between the portions of the specification.

The specification constraint recording section 12 records/holds constraints 22 associated with a specification.

The specification moving section 13 serves to determine whether a specification can be moved while its contents are held, display a destination when the specification can be moved, and move the specification, i.e., correct part of the specification.

Figure 2:
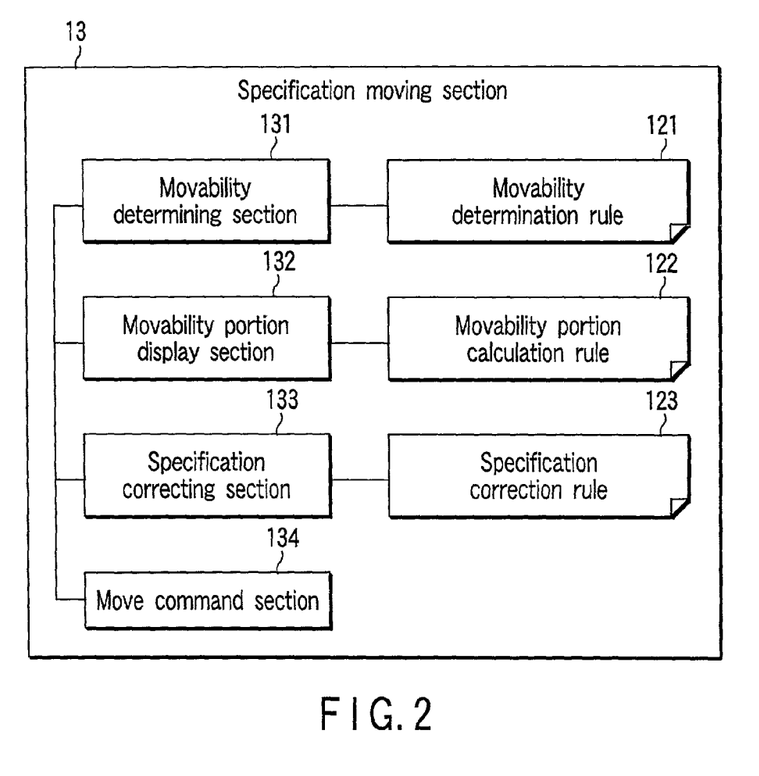
FIG. 2 is a block diagram showing an internal arrangement of the specification moving section of the specification operating apparatus according to the embodiment.

FIG. 2 shows an internal arrangement of the specification moving section 13. The specification moving section 13 includes a movability determining section 131, movability portion display section 132, specification correcting section 133, and move command section 134. The movability determining section 131 refers to specification constrains and determines whether part of a specification can be moved. If the specification can be moved, the movability portion display section 132 calculates specific points to which the specification can be moved, and displays destination candidates. The specification correcting section 133 makes preparations for movement of the specification before execution of a move command, and arranges the specification after movement. The move command section 134 executes a command for movement.

Figure 3:
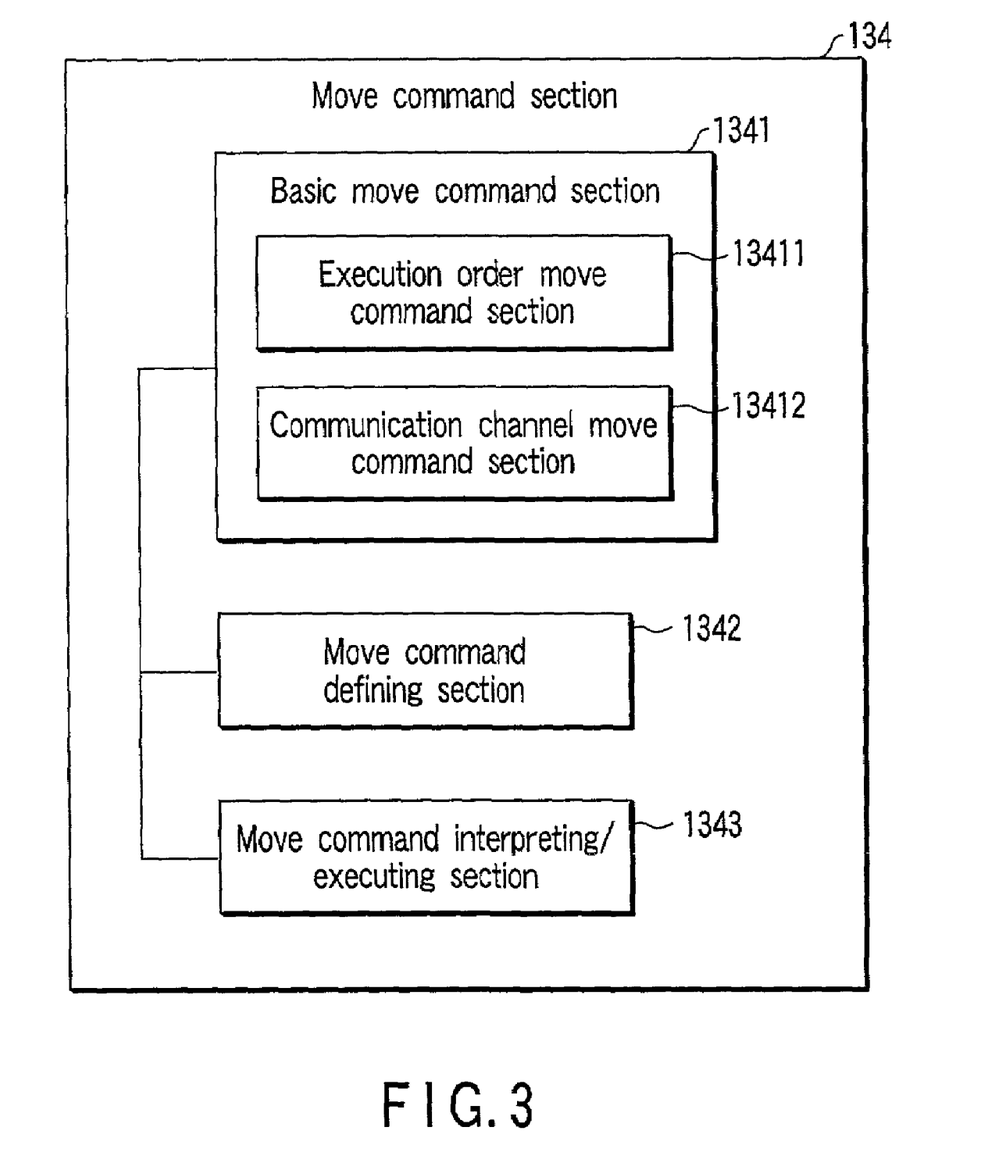
FIG. 3 is a block diagram showing an internal arrangement of the move command section of the specification moving section of the specification operating apparatus according to the embodiment.

FIG. 3 shows an internal arrangement of the move command section 134. The move command section 134 includes a basic move command section 1341, move command defining section 1342, and move command interpreting/executing section 1343. The basic move command section 1341 executes basic move commands for movement, and moves part of the specification throughout a hierarchical structure by using the basic move commands. The basic move command section 1341 includes an execution order move command section 13411 which executes an execution order move command for moving a specification across levels in association with the execution order, and a communication channel move command section 13412 which executes a communication channel move command for moving the specification across levels in association with communication. The move command defining section 1342 defines an arbitrary move command by combining basic move commands. The move command interpreting/executing section 1343 interprets a move command definition and executes movement (executes the move command in accordance with the command definition defined by the move command defining section 1342).

The specification operating apparatus of this embodiment includes description elements for allowing an user to describe at least "sequential execution", "repetitive execution", "interrupt end", "interrupt pause", and "parallel execution", and can describe an overall system specification by hierarchically combining these description elements.

System specification description schemes include StateChart for graphically describing specifications, SpecC (Specification description language based on C) language that expresses specifications in characters as a structural language, and the like. SpecC is described in detail in, for example, Daniel D. Gajski, "SpecC: Specification Language and Methodology", Kluwer Academic Publishers, Dordrecht, ISBN0-7923-7822-9.

In this embodiment, a system specification description scheme will be described below with reference to a description form based on the SpecC language. However, the present invention is not limited to the SpecC language.

<Structure of Specification>

In this embodiment, a specification is comprised of a plurality of basic units called "behaviors". A behavior can have a hierarchical structure. That is, one behavior can have a plurality of other behaviors as lower-level behaviors. A behavior corresponds to a function or class in a software specification; an LSI block in a hardware specification; and a job or task in a business process specification, for example.

"Structure of specification" defines the structure of a specification constituted by behaviors, and is comprised of a hierarchical structure associated with the execution order of behaviors and a hierarchical structure associated with data communication channels between the behaviors. The structure associated with the execution order and the structure associated with the communication channels have the same structure from the hierarchical viewpoint. More specifically, if behavior A is hierarchically higher than behavior B in terms of execution order, behavior A is also hierarchically higher than behavior B in terms of communication channels.

Depending on the structure of a specification, a specification dividing method for an architecture can also be defined. For example, with regard to an embedded system, the manner in which a specification is divided into portions corresponding to hardware and software is structured and described as a specification.

<Format of Specification>

Of the specification of a specification, a structure associated with an execution order is expressed as a hierarchical structure using at least four classifications of syntactic elements, namely "sequential execution and repetitive execution" (fsm), "parallel execution" (par), "synchronous execution" (fork, join, start, end), and "interrupt execution" (try, trap, itrp). Note that fsm is an abbreviation for finite state machine.

For example, fsm{a, b} expresses a specification stating that "$\underline{b}$ is executed after $\underline{a}$ is executed and completed", par{a, b} expresses a specification stating that "$\underline{a}$ and $\underline{b}$ are concurrently executed".

In addition, the hierarchical specification, fsm{a, par{b, c}, d}, expresses a specification stating that "$\underline{b}$ and $\underline{c}$ are concurrently executed after execution of $\underline{a}$, and $\underline{d}$ is executed after both $\underline{b}$ and $\underline{c}$ are completed"

In addition, try{a}trap(e){b} as a specification associated with "interrupt execution" expresses a specification stating that "$\underline{a}$ is executed first. If event $\underline{e}$ occurs during execution of $\underline{a}$, execution of $\underline{a}$ is forcibly ended, and execution of $\underline{b}$ is started".

A structure associated with communication channels defines the exchange of data between behaviors. Assume that communication channels are expressed by parts called variables and channels. Variables and channels are defined as parts immediately subordinate to higher-level behaviors in a hierarchical relationship in a specification, and the higher-level behaviors are connected to lower-level behaviors through connection ports called ports, thereby allowing the lower-level behaviors to communicate with each other through communication channel.

A communication channel corresponds to a variable or a function for communication in a software specification and to an interconnection for connecting LSIs in a hardware specification. A port is an input/output port for communication, which corresponds to an argument in a software specification and to a terminal for connecting parts through an inter-connection in a hardware specification. A channel is a part for receiving a command specially prepared to transmit/receive data. For example, commands such as "put (data)" and "get ( )" are conceivable. A variable can be regarded as a kind of channel having a write "write(data)" command and read "read( )" command.

Simple syntactic elements and rules of the SpecC language will be described below.

system description=set of "behavior descriptions"

behavior description={communication element, . . . , processing content} where communication element=variable, channel processing content=behavior(port, . . . ), execution procedure description execution procedure description = fsm{...}, par{...}, = try{...}trap(e){...}itrp(e){...}

In the behavior description sample i, j, k, fsm{A(i), B(i, j), C(k)}, $\underline{i}$, $\underline{j}$, and $\underline{k}$ are local variables, and A, B, and C are lower-level behaviors, each having a port, which is connected to a local variable.

par{A, B, C}

This processing content sample indicates that A, B, and C are concurrently executed.

fsm{ {1, A, goto(2) },
 {2, B, flg= =3: goto(1), flg= =1: goto(2) }
}

In this case, each element of fsm is formed by any one of {label, processing content, {condition: transition upon establishment of condition}, . . . }, {label, processing content, transition upon completion of processing, . . . }, {label, processing content} and processing content These elements are sequentially executed from the left unless otherwise specified. If there is no transition label item, {label, processing content} executes the next fsm element upon completion of the processing content. Assume that label=1 or the leftmost fsm element is executed first. A transition is expressed by "goto(x): X is label number". For example, goto(1) indicates that the flow returns to the first fsm element.

The above case indicates the following operation. When A is executed and completed, B is executed. When B is completed, A is executed if the value of the variable flg is 3, and B is executed if the value is 1.

As in the following example, an element without any label can be regarded as a simplified form of given execution control using a label.

fsm{A, B, C}=fsm{{1, A, goto(2)}, {2, B, goto(3)}, {3, C, ...}, ...}·try{A}trap(ev1){B}itrp(ev2){C}...

In the case of this language element, A is executed first. If event ev1 occurs during execution of A, A is forcibly ended, and B is executed. If event ev2 occurs during execution of A, A is paused, and C is executed. When C is completed, A is resumed.

Note that each of trap(e) {X} and itrp(e2){Y} may be more than one.

wait(ev)

This is synchronous processing which waits for the occurrence of event ev.

notify(ev)

This is synchronous processing that causes event ev.

flg=X

This is a substitution of a value into variable flg.

flg==X

This is condition determination.

start(ID);
fork(ID);

This is synchronous processing I; start and fork are synchronous executed.

end(ID);
join(ID);

This is synchronous processing II; end and join are synchronous executed.

The following is a specification sample conforming to the format enumerated above and having a hierarchical structure:

EXAMPLE ex0

A:={i, par{B(i), g(i)}}
B(i):={j, k, fsm{a(j), b(k, i), C(k)}>}
C(k):={par{d, e, f(k)}}

This expresses the following specification:

"Behavior A is constituted by sub-behaviors B, C, g, a, b, e, and f, and behavior A is constituted by lower levels B and g. B and g are concurrently executed. B, which is hierarchically lower than A, is constituted by lower-level elements a, b, and C, which are sequentially executed. C, which is hierarchically lower than B, is constituted by lower-level elements d, e, and f, which are concurrently executed. A has communication channel i, and port i of B and is connected to port i of g through i. B has communication channels j and k, port j of lower-level element a is connected to communication channel j. Port k of b is connected to communication channel k, port i of b is connected to port i of B, port k of C is connected to communication channel k, and port k of C is connected to port k of f. That is, a behavior f and behaviors b, g and b are connected through communication lines, respectively, to exchange data across hierarchical levels."

For the sake of descriptive convenience, consider a case where communication channels and a hierarchical relationship are simplified in consideration of the execution order. When, for example, the above specification example (ex0) is simplified in consideration of the execution order, a specification can be described as follows:

A:=par{fsm{a, b, par{d, e, f}}, g}

For the sake of descriptive convenience, consider a case where the execution order is simplified in consideration of communication channels and a connection relationship. When the above specification example (ex0) is simplified in consideration of the communication channels and connection relationship, a specification can be described as follows:

A:={i, bh{B(i), g(i)}}
B(k):={i, j, bh{a,(i), b(i, j), C(j)}>}
C(j):={bh{d, e, f(j)}}

Pairs of fork(x) and start(x), and end(x) and join(x) represent a synchronization constraint and define that these elements are always executed in pairs (in this case, x represents an id number, and a pair having identical id numbers are synchronously executed).

For example, the following specification:

par{fsm{1, fork(2), join(2), 3}, fsm{start(2), 2, end(2), 4}} hierarchically indicates that sequential executions (fsm) 1 to 3 and 2 to 4 are concurrently executed (par). Obviously, however, sequential execution 2 is executed between sequential executions 1 and 3 according to the synchronous relationship between for, join, start, and end.

With regard to the structure of communication channels, the above specification example (ex0) indicates that f and b can exchange data with each other through communication channel j of B, and a, b, and g can exchange data with each other through communication channel i of A.

<Specification Constraint>

Assume that in the specification operating apparatus of this embodiment, a constraint associated with a specification description is recorded on the specification constraint recording section 12, and it can be determined on the basis of this specification constraint whether to hold the contents of a specification.

<Execution order constraint>

An execution order constraint is a constraint associated with an execution order among behaviors in executing the respective behaviors. An execution order relation can be expressed by an order relation ">". For example, "A>B" represents a constraint that B is executed after execution of A. According to this order relation, if A>B and B>C, then A>C (transitivity of order).

An execution order constraint on a set of behaviors constituting a specification can be expressed as a set of order relations ">" among the behaviors. According to this execution order constraint, order relations need not be defined for all combinations of behaviors. In this sense, this constraint is a pseudo-order set. For example, a specification stating that A and B are executed parallel is valid as a specification although it does not define which one of A and B should be executed first.

A priority relation between execution order constraints can be defined by using the property of an order relation in a specification description, i.e., "A total order set can be finally obtained by sequentially adding consistent order relations to an arbitrary pseudo-order set supplied". That is, when an order constraint x is added to a pseudo-order set A to obtain a pseudo-order set B, it is defined that "B is stronger than A" and "A is weaker than B".

<Relationship Between "Execution Order" and "Execution Order Constraint">

One execution order constraint can be determined from a supplied "specification structure".

For example, fsm{1, 2} defines an order in which 2 is executed after 1, and an only execution order constraint corresponding to this definition is {1>2}.

In addition, par{1, 2} indicates that no special constraint is imposed on the order of 1 and 2, and it does not matter whether they are executed parallel or one of them is executed first. The corresponding execution order constraint is { }. In this case, only two execution order constraints {1<2} and {2<1} are stronger than { } in association with par{1, 2}.

Let execution order constraint B on specification structure A be stated as:

"A implies B".

If all the pseudo-order relations included in execution order constraint B are consistent with specification structure A, let this relationship be stated as:

"A satisfies B".

If A implies B, A satisfies B. However, if A satisfies B, A does not always imply B.

For example, in the following example:

A1: fsm{1, fsm{2, 3}, 4}
A2: fsm{1, par{2, 3}, 4}
B1: {1<2, 2<3, 3<4}
B2: {1<2, 1<3, 2<4, 3<4}

A1 implies B1, and A2 implies B2. Although both A1 and A2 satisfy B1 and B2, A2 does not imply B1 (the order of 2 and 3 is unknown). A1 does not also imply B2 (2<3 cannot be derived from B2).

A plurality of specification structures may satisfy a set of arbitrary execution order constraints supplied. Since a structure is hierarchical, an infinite number of specification structures that can satisfy a set of supplied execution order constraints exist; they cannot be counted up.

Supplied specification structure A implies only one execution order constraint B. With respect to specification structure A, all execution order constraints stronger than execution order constraint B can be counted. For example, the following specification structure:

fsm{1, 2, par{3, fsm{4, 5}, 6}, 7} implies the following execution order constraint:

R0={1<2, 2<3, 2<4, 2<6, 4<5, 6<7, 3<7, 5<7}

By adding order relations to the "par" portion, with respect to the above structure fsm{1, 2, par{3, fsm{4, 5}, 6}, 7}, all execution order constraints stronger than R0 can be obtained. In this case, they are:

R1=R0∪{3<4, 5<6}
R2=R0∪{5<6, 6<3}
R3=R0∪{3<6, 6<4}

Note that ∪ represents a calculation of a sum of sets. That is, four execution order constraints can be obtained, including R0.

<Constraints on Communication Channels and Connection Relationship>

Constraints on the levels of behaviors to which communication channels belong will be described below.

"A communication channel must be defined in a behavior hierarchically higher than that of any behaviors connected to each other through the communication path".

The following specification example (ex1) indicates a specification in which behaviors B and A are connected to each other through communication channel c belonging to D. Since D to which c belongs is hierarchically higher than B and A, the constraint is observed.

EXAMPLE ex1

E:={bh{D}}
D:={c, bh{B(c), A(c)}}

The following specification example (ex2) exemplifies a case where the behavior to which c belongs in specification example (ex1) is moved to E hierarchically higher than D.

EXAMPLE ex2

E:={c, bh{D(c)}}
D(p):={bh{{bh{B(p), A(p)}}}}

In specification example (ex2) as well, the connection relationship between B and A is held in the same manner as in specification example (ex1), and the constraint concerning to which a communication channel belongs is also observed. Therefore, a communication channel can belong to both specification example (ex1) and specification example (ex2), and the two specifications can be mutually converted. In this case, the behavior to which a communication channel belongs cannot be moved from B to A because of violation of the constraint.

<Equivalency Between Specification Structures and Strong Constraint>

Assume that two "specification structures" A and B are provided. In this case, if the respective specification structures imply the same execution order constraint, then "A and B are equivalent to each other in terms of execution order constraint"

If the execution order constraint implied by one specification structure A is stronger than the other specification structure B, then "Execution order constraint is stronger than that on B"

Examples of "specification structures" equivalent to each other in terms of execution order constraint are shown below.

For example, in the following specification examples,

EXAMPLE ex1a par{fsm{1, 2}, fsm{3, 4, fsm{5, 6}}}

EXAMPLE ex2a par{fsm{1, 2}, fsm{3, fsm{4, 5, 6}}}

EXAMPLE ex3a par{fsm{1, 2}, fsm{3, 4, 5, 6}} since specification example (ex2a) and specification example (ex3a) imply the same execution order constraint {1<2, 3<4, 4<5<, 5<6} with respect to specification example (ex1a), they are equivalent to each other.

In addition, the following specification example (ex4a) using synchronization is an example of a specification structure equivalent to specification examples (ex1a), (ex2a), and (ex3a) described above.

EXAMPLE ex4a par{fsm{1, fsm{start(4), 4, end(4)}, 2},
fsm{3, fsm{fork(4), join(4)}, 5, 6}}

The following is an example of a specification structure with a strong constraint.

For example,

EXAMPLE ex1b fsm{1, par{2, 3}, 4}

With respect to this specification example, the execution order constraint implied by (ex1b) is {1<2, 1<3, 2<4, 3<4}  (ecs1b)

EXAMPLE ex2b fsm{1, 2, par{3}, 4}

In this specification example, the execution order constraint implied by (ex2b) is {1<2, 2<3, 3<4}  (ecs2b)

The above execution order constraint (ecs2b) includes execution order constraint (ecs1b) as a pseudo-order set (1<3 is included in {1<2, 2<3}). Therefore, execution order constraint (ex2b) is a strong constraint relative to execution order constraint (ex1b).

Likewise, specification examples (ex3b) and (ex4b) described below are examples of specification structures with a strong constraint relative to specification example (ex1b).

fsm{1, 3, par{2}, 4}  (ex3b)

fsm{1, par{2}, 3, 4}  (ex4b)

<Conversion of Specification Structure>

Conversion of a provided specification structure into another specification structure having an equivalent execution order constraint or another specification structure having an execution order constraint stronger than that on the original specification structure is defined as "conversion of a structure without any change in specification contents."

<Example of Move Command>

The following is an example of a move command for moving part of a specification to another part on the basis of "execution order constraint" while "the contents of the specification are maintained". Obviously, the present invention is not limited to the following example. When another specification constraint is to be used in the present invention, another type of "maintaining the contents of a specification" definition or move command can be used.

<Command for Moving Communication Channel>

<<Communication Channel Move Command Section>>

A move command associated with a communication channel is executed by the communication channel move command section 13412. The move command is constituted by two types of commands, namely pop and push, which are commands for vertically moving the belonging portion of a channel or variable (to which behavior it belongs) along the levels of behaviors.

pop(variable/channel to be moved)
push(variable/channel to be moved)

Assume that behavior D is located hierarchically below behavior E, a level below behavior D is constituted by behaviors A and B which communicate with each other, and A and B are connected to each other through channel $\underline{c}$ belonging to D. The following is an example (ex1c) of such a specification structure:

EXAMPLE ex1c

E:={bh{D}}
D:={c, bh{B(c), A(c)}}

The pop move command moves the belonging portion of a channel or variable to a behavior at a level immediately higher than the current level. The following example (ex2c) is obtained by applying a pop(c) move command to example (ex1c).

EXAMPLE ex2c

E:={c, bh{D(c)}}
D(p):={bt{{bh{B(p), A(p)}}}}

According to example (ex2c), the belonging portion of channel $\underline{c}$ is changed from D to E. At this time, new port $\underline{p}$ is defined for behavior D to ensure a communication channel between A and B, and a connection relationship between A, B, and A is added.

The push command moves the belonging portion of a channel or variable to a level immediately lower than the current level. In the above example, when a push(c) command is executed in (ex2c), (ex1c) is obtained. Example (ex1c) represents the lowest-level behavior (belonging portion) which communication channel $\underline{c}$ between A and B can take. That is, the push(c) command is invalid with respect to the push(c) command. As described above, there is no limit on pop, but there is a lower limit on push. The lowest level of a belonging portion is equal to the highest level of behaviors that participate in communication.

<Basic Move Commands for Specification Associated with Execution Order>

<<Execution Order Move Command Section>>

Movement associated with an execution order is executed by the execution order move command section 13411. The execution order move command section 13411 is constituted by four types of basic move commands, pop commands for movement from a lower-level behavior to an upper-level behavior and push commands for movement from an upper-level behavior to a lower-level behavior:

pop(behavior to be moved)
pop(behavior to be moved, destination)
push(behavior to be moved, destination)
push(behavior to be moved)

If a single destination is specified, the destination is designated by a command with one argument; otherwise, the destination is designated by a command with two arguments. The movability determining section 131 then moves the corresponding behavior.

<Procedure for movement>

Figure 4:
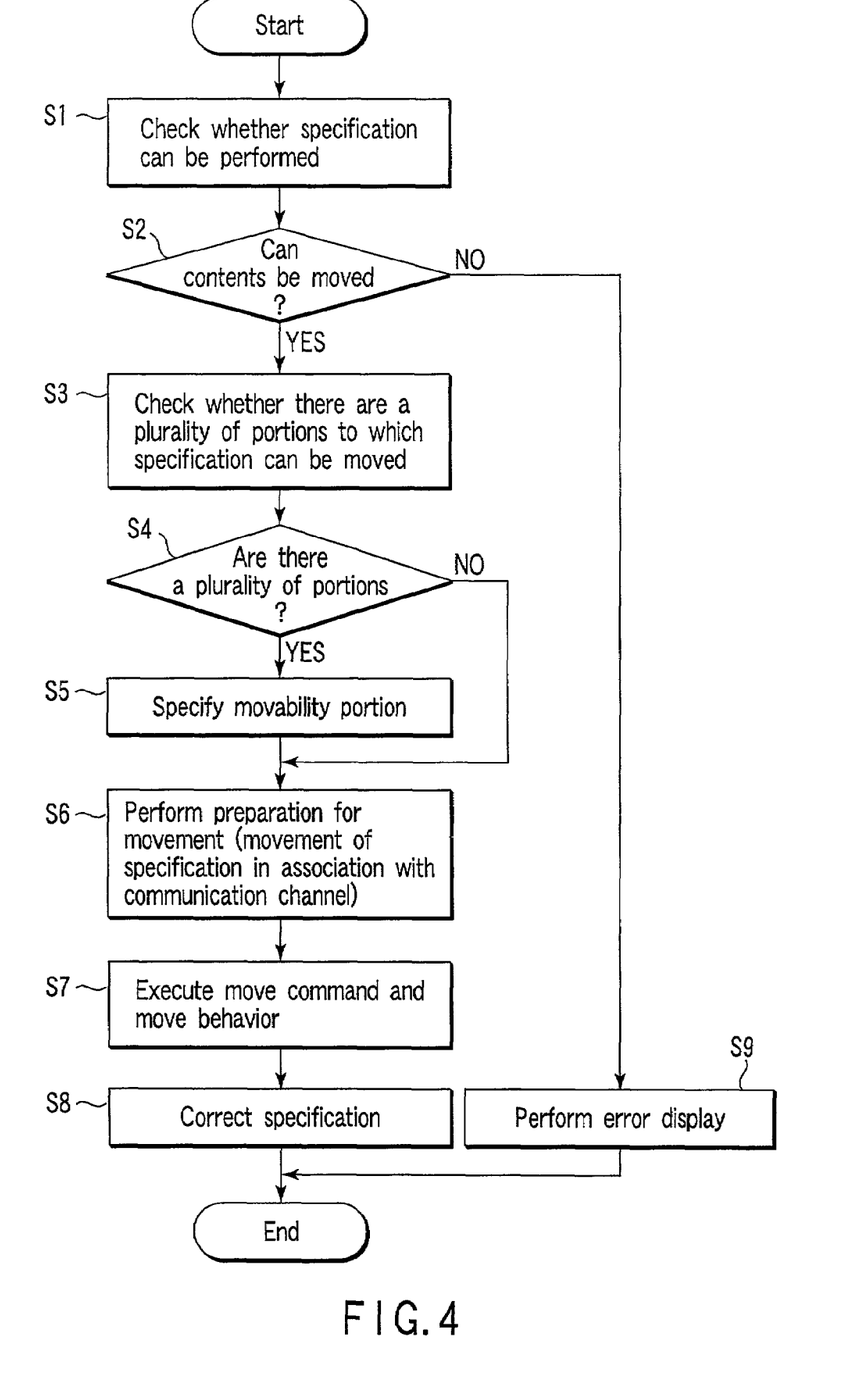
FIG. 4 is a flow chart showing a procedure for moving a specification in a specification moving section 13.

Specification movement processing in the specification moving section 13 will be described below.

FIG. 4 shows an example of the specification movement procedure executed by the specification moving section 13.

First of all, the movability determining section 131 checks whether the specification can be moved (step S1)

If the specification can be moved (YES in step S2), the movability portion display section 132 calculates destination candidates and checks whether there are a plurality of candidates (step S3). If there are a plurality of candidates (YES in step S4), a portion is limited to specify a destination (step S5).

If a communication channel must be moved to an upper level in advance because a constraint about the level of the communication channel is satisfied even after movement, the corresponding communication channel is moved in advance to the upper level at which the constraint is satisfied, as a preparation for movement, by using the above communication channel move command (step S6). The behavior is then vertically moved across levels by an execution order move command (step S7). The specification is then corrected so as not to violate the execution order constraint (step S8).

If movement cannot be performed (NO in step S2), for example, processing like error display is performed (step S9).

In moving behaviors, the push/pop move commands behave differently depending on the combination of types of upper and lower levels (fsm or par). Each case will be described below.

In the following example, movability is determined on the basis of a movability determination rule, calculation of a destination is performed on the basis of a movability portion calculation rule, and correction of a specification is performed on the basis of a specification correction rule.

The specification movement rule will be exemplified below.

$$\text{Upper level=fsm/lower level=fsm} \tag{1}$$

[Movability Determination Rule]
Only behaviors adjacent to each other in terms of level can be moved to upper and lower levels.

[Movability Portion Calculation Rule]
Portions to which behaviors can be moved are portions adjacent to each other through a level.

In this case, behaviors adjacent to each other in terms of level are end and start behaviors of fsm when behaviors are to be moved to an upper level. When behaviors are to be moved to a lower level, they are behaviors adjacent to the lower level. For example, according to fsm{1, 2, fsm{3, 4, 5}, 6, 7}

1, 3, 5, and 7 can be moved to an upper level, and 2 and 6 can be moved to a lower level. Behavior 2 can be moved to a portion immediately before behavior 3, behavior 5 can be moved to a portion immediately before behavior 6, and behavior 3 can be moved to a portion immediately after behavior 3.

$$\text{Upper level=par/lower level=par} \tag{2}$$

[Movability Determination Rule]
An arbitrary behavior can be moved.

[Movability Portion Calculation Rule]
A movability portion can also be moved to an arbitrary portion.

$$\text{Upper level=fsm/lower level=par} \tag{3}$$

[Movability Determination Rule]
An arbitrary behavior at a lower level can be moved from the lower level (part) to the upper level (fsm).
In moving a behavior from a lower level (par) to an upper level (fsm), the behavior can be moved to only a portion immediately after a behavior adjacent to the lower level.

[Movability Portion Calculation Rule]
Only a behavior adjacent to a lower layer can be moved from the upper level to the lower level.
In moving the behavior from the upper level to the lower level, the behavior can be moved to an arbitrary portion at the lower level.

[Specification Correction Rule]
In moving a behavior from an upper level to a lower level, proper synchronization processing is performed for the specification to hold the order constraint.

$$\text{Upper level=par/lower level=fsm} \tag{4}$$

[Movability Determination Rule]
An arbitrary behavior at an upper level can be moved from the upper level to the lower level.
An arbitrary behavior at a lower level can be moved from the lower level to the upper level.

[Movability Portion Calculation Rule]
When a behavior is moved from an upper level to a lower level, the behavior can be moved to an arbitrary portion at the lower level.
When a behavior is moved from a lower level to an upper level, the behavior can be moved to an arbitrary portion at the upper level.

[Specification Correction Rule]
In movement from a lower level to an upper level, proper synchronization processing is performed for a specification to hold an order constraint.

The following is a summary of the above exemplified rules for movement.

<Case 1: Upper Level=FSM, Lower Level=FSM>

<<Pop Command>>
If the following specification (1) is given $$\text{fsm}\{1, 2, \text{fsm}\{3, 4, 5\}\} \tag{1}$$

then, the execution order constraint implied by the structure of specification (1) is given by $$\{1<2, 2<3, 3<4, 4<5\} \tag{2}$$

Assume that with respect to specification (1), a "pop(3)" move command for moving behavior 3 to a level immediately higher than the current level is executed. When the movability determining section 131 checks the movability determination rules, it is found that 3 is a behavior adjacent to the upper level, and hence can be moved. With regard to a movability portion, according to the rules, since behavior 2 is adjacent to behavior 3 at an upper level across the levels, behavior 3 can be inserted immediately after behavior 2.

When a "pop(3)" move command for moving behavior 3 to a level immediately higher than the current level is executed with respect to specification (1), the following equivalent specification structure (3) can be obtained.

$$\text{fsm}\{1, 2, 3, \text{fsm}\{4, 5\}\} \tag{3}$$

If a pop(5) command is executed with respect to specification (1), a behavior can be moved to a portion immediately after the following fsm level. As a consequence, the following specification structure (4) is obtained.

$$\text{fsm}\{1, 2, \text{fsm}\{3, 4\}, 5\} \tag{4}$$

If a pop(4) command is executed with respect to specification (1), an execution order constraint is violated according to the movability determination rules. Therefore, such movement cannot be performed.

If, for example, pop(4) is executed immediately after behavior 2, the following specification (5) is obtained.

$$\text{fsm}\{1, 2, 4, \text{fsm}\{3, 5\}\} \tag{5}$$

Specification (5) contradicts the execution constraint stating that specification (1) implies "$\{3<4\}$".

If pop(4) is executed at the end of fsm in specification (1), specification (6) is obtained.

$$\text{fsm}\{1, 2, \text{fsm}\{3, 5\}, 4\} \tag{6}$$

However, specification (6) also contradicts the constraint stating that specification (1) implies "$\{4<5\}$".

<<Push Command>>

When specification (7) is provided $$\text{fsm}\{1, \text{fsm}\{2, 3\}, 4, 5\} \tag{7}$$

Specification (7) implies the following execution order constraint (8).

$$\{1<2, 2<3, 3<4, 4<5\} \tag{8}$$

In this case, a "push(1)" move command is executed with respect to specification (7). When the movability determining section 131 refers to the movability determination rule, since 1 is adjacent to a level, it can be moved to a lower level. According to the movability portion calculation rule, a portion to which 1 can be moved is located immediately before 2.

As a result of execution of a "push(1, immediately before 2)" command, 1 is moved to a level immediately lower than the current level, and specification (9) is obtained:

$$\text{fsm}\{\text{fsm}\{1, 2, 3,\}, 4, 5\} \tag{9}$$

According to the movability determination rule, in the case of fsm/fsm, since only a behavior adjacent to a lower level can be "pushed", the "push(5)" command cannot be executed with respect to specification (7).

<Case 2: Upper Level=PAR, Lower Level=PAR>

<<Pop Command>>

When the following specification structure (1a) is Provided $$\text{par}\{1, \text{par}\{2, 3\}, 4\} \tag{1a}$$

specification (1a) implies the following execution order constraint (2a) (defines no order).

$$\{\} \tag{2a}$$

Assume that a "pop(2)" move command is executed with respect to specification (1a). In this case, the movability determining section 131 refers to the movability determination rule to find that behavior 2 can be moved. In addition, the movability portion display section 132 refers to the movability portion calculation rule to find that the behavior can be moved to an arbitrary portion. Since movability portions "immediately before and after 1 and immediately before and after 4" are displayed, the designer selects "immediately after 1" and executes a "push(2, immediately after 1)" move command. As a consequence, the structure is changed to obtain the following new specification (3a):

$$\text{par}\{1, 2, \text{par}\{3\}, 4\} \tag{3a}$$

<<Push Command>>

According to the movability determination rule, in the case of "par/par", like pop, push can move an element at an arbitrary upper level to an arbitrary portion at a lower level.

If, for example, the movability determining section 131 executes a push(4) move command with respect to specification (1), the following three possible specifications are obtained.

$$\text{par}\{1, \text{par}\{2, 4, 3\}\}$$

$$\text{par}\{1, \text{par}\{2, 3, 4\}\}$$

$$\text{par}\{1, \text{par}\{4, 2, 3\}\} \tag{4a}$$

These are identical (equivalent) specifications in terms of an execution order constraint.

<Case 3: Upper Level=FSM, Lower Level=PAR>

<<Pop Command>>

Assume that a "pop(2)" move command is executed with respect to the following provided specification (1b):

$$\text{fsm}\{1, \text{par}\{2, 3\}, 4\} \tag{1b}$$

In this case, the movability determining section 131 refers to the movability determination rule to find that movement can be performed. Adjacent behaviors are 1 and 4. According to the movability portion display section 132, therefore, a portion "immediately after 1 or immediately before 4" is a movability portion.

If a "pop(2, immediately after 1)" move command is executed, the specification structure given by $$\text{fsm}\{1, 2, \text{par}\{3\}, 4\} \tag{2b}$$

can be obtained.

If a "pop(2, immediately before 4)" move command is executed, the specification structure given by $$\text{fsm}\{1, \text{par}\{3\}, 2, 4\} \tag{3b}$$

can be obtained.

This applies to a "pop(3)" move command.

<<Push Command>>

Assume that a "push(1)" move command is executed with respect to the following specification structure (4b):

$$\text{fsm}\{1, \text{par}\{2, 3\}, 4\} \tag{4b}$$

In this case, the movability determining section 131 refers to the movability determination rule to find that only a nearby behavior can be moved (pushed) from an upper level to a lower level. Since 1 is a behavior near the lower level, it can be moved. According to the rule, since proper synchronization processing must be performed in movement, synchronization processing and a specification structure change associated with the processing must be performed to hold the execution order {1<2, 1<3}.

$$fsm\{par\{fsm\{1, end(1)\}, fsm\{join(1), 2\}, fsm\{join(1), 3\}\}, 4\} \quad (5b)$$

In this case, although 1, 2, and 3 are concurrently executed within par, and 2 and 3 are activated after 1 is completed by a synchronizing mechanism.

The same processing is performed with respect to the "push(4)" move command. In this case, according to the order constraint {2<4, 3<4}, both 2 and 3 must be terminated to start 4. For this reason, a level at which two elements "join" are enclosed with par is prepared, and the synchronization timing at which both 2 and 3 are terminated is made to coincide with the start timing of 4.

$$fsm\{1, par\{fsm\{par\{join(2), join(3)\}, \}$$

$$fsm\{2, end(2)\},$$

$$fsm\{3, end(3)\}\}\} \quad (6b)$$

<Case 4: Upper Level=PAR, Lower Level=FSM>

<<Pop Command>>

Assume that the "pop(4)" move command is executed with respect to the following specification (1c):

$$par\{1, 2, fsm\{3, 4, 5\}\} \quad (1c)$$

In this case, the movability determining section 131 refers to the movability determination rule to find that an arbitrary behavior can be moved from the lower level fsm to the upper level par. Therefore, behavior 4 can be moved. According to the movability portion rule, the behavior can be moved to an arbitrary portion. According to the specification correction rule, proper synchronization processing must be performed for movement. On the basis of this rule, a move command is executed. The following specification (2c) is finally obtained by performing the synchronization processing.

$$par\{1, 2, fsm\{start(4), 4, end(4)\}, fsm\}3, fork(4),$$

$$join(4), 5\}\} \quad (2c)$$

According to specification (2c), 4, 3, and 5 are executed parallel by par. With the synchronization processing (start, end, fork, join), however, 4 is executed after 3 is completed, and 5 is executed after 4 is completed. This indicates that the initial execution order constraint {3<4, 4<5} is maintained.

This applies to the pop(3) and pop(5) commands.

<<Push Command>>

Assume that the "push(2)" move command is executed with respect to specification (1c). In this case, the movability determining section 131 finds that when an arbitrary element is to be moved from an upper level (par) to a lower level (fsm), the element can be moved to an arbitrary portion. Therefore, the move command "push(2, between 3 and 4)" for designating a destination is executed to obtain specification (3c):

$$par\{1, fsm\{3, 2, 4, 5\}\} \quad (3c)$$

<Case 5: Combination of Basic Move Commands>

An arbitrary move command can be realized by combining basic move commands. As a means for designating a method of combining commands, a procedural high-level language is used. As a high-level language, a script language (JavaScript) or UNIX shell (sh, bash, csh) may be used.

For example, a relocate_cnc command for moving an element included in fsm hierarchically located below par between adjacent levels fsm is defined (by the move command defining section 1342) as:

relocate_cnc (movement target, destination)="push (movement target, destination) is executed after pop(movement target) is executed"

When relocate_cnc(2, between 4 and 5) is executed with respect to the following specification (1d):

$$par\{fsm\{1, 2\}, fsm\{3, 4, 5\}\} \quad (1d)$$

the move command interpreting/executing section 1343 executes the contents of relocate_cnc in accordance with the command definition.

First of all, "pop(2)" is executed to obtain the following specification (2d):

$$par\{fsm\{join(1), 2\}, fsm\{1, end(1)\}, fsm\{3, 4, 5\}\} \quad (2d)$$

In addition, "push(2, between 4 and 5)" is executed to obtain specification (3d):

$$par\{fsm\{1, end(1)\}, fsm\{3, 4, fsm\{join(1), 2\}, 5\}\} \quad (3d)$$

This structure is hierarchically simplified with respect to fsm to finally obtain $$par\{fsm\{1, end(1)\}, fsm\{3, 4, join(1), 2, 5\}\} \quad (4d)$$

According to another example, a relocate_seq command for moving an element included in fsm hierarchically located below fsm between levels fsm is defined (by the move command section 134) as:

relocate_seq(movement target, destination)="push(movement target, destination) is executed after pop(movement target) is executed"

When a relocate_seq(2, immediately before 3)" command is executed with respect to the following specification (5d):

$$fsm\{fsm\{1, 2\}, fsm\{3, 4, 5\}\} \quad (5d)$$

the move command section 134 refers to the move command definition to sequentially execute push and pop commands to obtain the following specification (6d):

$$fsm\{fsm\{1, fsm\{2, 3, 4, 5\}\} \quad (6d)$$

In this case, the movability determining section 131 also determines movability by referring to this move command definition and the movability determination rule for each basic command and combining them. In the above case, only relocate_seq(2, immediately before 3), only relocate_seq(3, immediately after 2) can be executed.

<Specification Constraint Recording Section>

The specification constraint recording section 12 records/holds, for example, an execution order constraint corresponding to a specification structure. Note that the execution order constraint and specification structure are associated with each other but independent of each other.

For example, the execution order constraint implied by specification (1e)

$$par\{1, 2, fsm\{3, 4, 5\}\} \quad (1e)$$

is $$\{3<4, 4<5\} \quad (2e)$$

This constraint is recorded on the specification constraint recording section 12 and a series of move commands are executed.

If, for example, "push(2, between 3 and 4)" is executed with respect to specification (1e), specification (3e) is obtained.

$$par\{1, fsm\{3, 2, 4, 5\}\} \quad (3e)$$

If the "pop(2)" command is executed with respect to this specification (3e), specification (4e) is obtained.

$$par\{1, fsm\{join(3), 2, end(2)\}, fsm\{3, end(3),$$
$$join(2), 4, 5\}\} \quad (4e)$$

When execution order constraint (2e)={3<4, 4<5} is referred to by referring to the specification constraint recording section 12, synchronization processing is useless, and hence is deleted to obtain the same structure as that of the initial specification (1e).

When the "push(2, between 4 and 5)" command is executed, the following specification (5e) is obtained:

$$par\{1, fsm\{3, 4, 2, 5\}\} \quad (5e)$$

When the initial order constraint is extracted from specification (1e) and move command operation is performed (which corresponds to a case where an arbitrary move command is created in accordance with a combination of basic move commands) on the basis of the constraint, the order constraint implied by a specification structure as an interim result is not an order constraint to be considered in movement but is the order constraint implied by the initial specification structure recorded on the specification constraint recording section 12. Movement that violates the order constraint, like conversion from specification (3e) to specification (5e), is included in the intermediate state of conversion.

<Interrupt>

The above description has excluded a case where a description (try/trap/itrp) associated with an interrupt in a specification structure for the following reason. The description associated with an interrupt is localized in advance, and the localized partial structure can be handled as a single behavior. As a whole, therefore, the interrupt structure can be removed to obtain a hierarchical structure constituted by only par and fsm.

For example, the following behavior
try{fsm{a, b, c}}trap(e){fsm{d}} states that "If event e occurs during sequential execution of a, b, and c, the execution of a, b, and c is stopped, and d is executed. If no event e occurs, the processing is terminated at the end of c". By moving the try/trap structure to a lower level, the specification can be converted into the following equivalent specification structure:

par{fsm{try{a}trap (e) {flg=1, en(a)}
try{b}trap (e) {flg=1, en(b)}
try{c}trap(e) {flg=1, en(c)}
flg=0, end(abc)}
fsm{join (a, b, c, abc), flg=0: fsm{d}}}

In this case, the initial order constraint is maintained by the synchronizing mechanism and the value of the flg flag.

Figure 5:
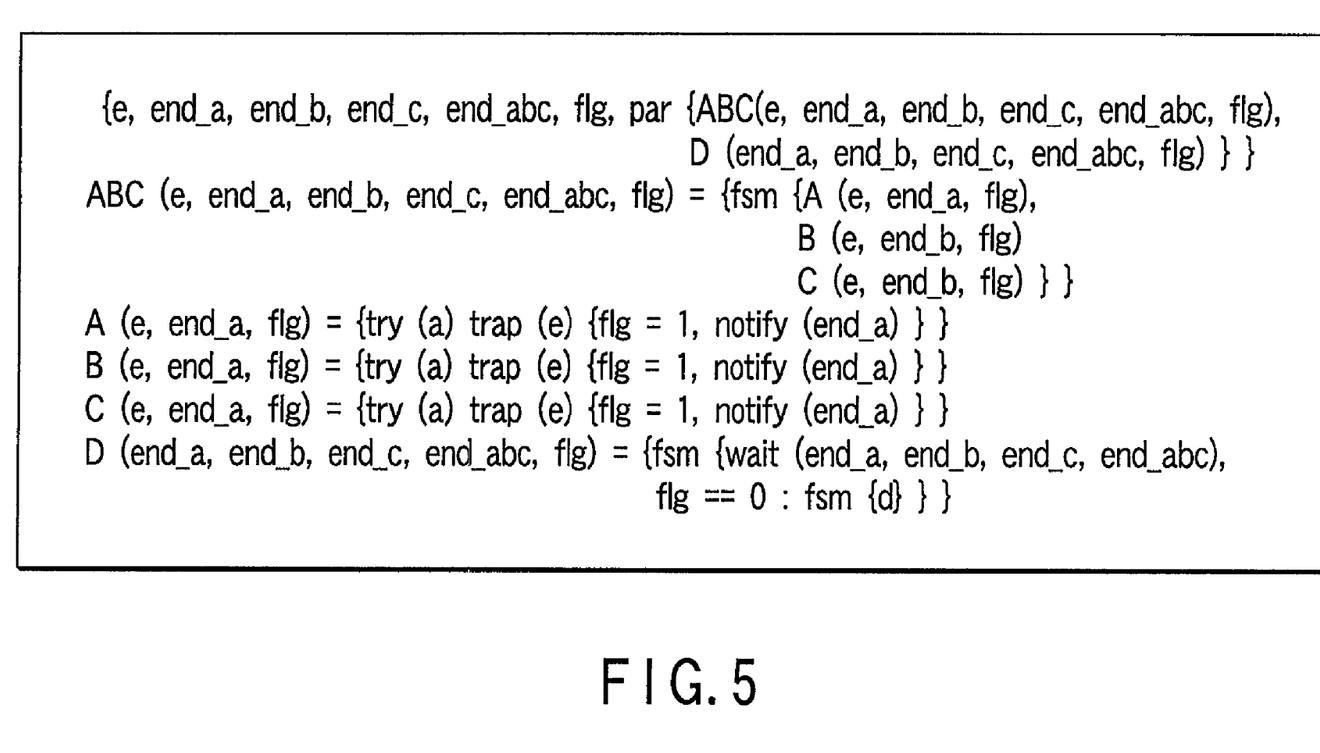
FIG. 5 is a view showing an example of a specification in a system description language form.

In addition, try/trap can be concealed from the structural viewpoint by creating a macro like that shown in FIG. 5.

Each function described above can be implemented as software.

In addition, this embodiment can be practiced as a computer program product for causing a computer to realize predetermined functions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for operating a specification of a system, comprising:
    storing a structure of the specification described in a system description language in a storage unit, the specification being composed of a plurality of behaviors;
    storing constraint information indicating a set of first execution order constraints each represented by an order relation of the behaviors and associated with the specification in the storage unit;
    converting the specification to another specification having a set of second execution order constraints equivalent to the set of first execution order constraints or having a set of third execution order constraints stronger than the set of first execution order constraints by referring to the constraint information of the storage unit; and
    moving contents of a predetermined portion of the specification in the structure of the specification to another portion in the structure thereof to change the structure of the specification while the contents of the specification are maintained, by subjecting a first thread of the specification to synchronization processing using a pair of start (x) and fork (x) and a pair of end (x) and join (x), (x represents an ID number), the pair of the start (x) and fork (x) having identical ID numbers being synchronously executed, and the pair of the end (x) and join (x) having identical ID numbers being synchronously executed, in communications to guarantee to execute sequentially the behaviors of the first thread of the specification according to an execution order, the moving including:
    determining whether or not contents of the predetermined portion in the structure of the specification are able to be moved based on a movability determination rule;
    displaying destination candidates on a display device when the moving is able to be performed;
    specifying one destination referring to the displayed destination candidates;
    calculating the another portion in the structure based on a movability portion calculation rule in response to the specifying of the one destination;
    correcting part of the specification to perform the movement based on a specification correction rule; and
    moving the contents of the predetermined portion to said another portion by:
    executing the pair of the fork (x) and the start (x), by executing the fork (x) in the first thread, wherein executing the fork (x) halts execution of the first thread and moves execution of a behavior in the first thread to a second thread, and executing the start (x) in a second thread,
    executing the behavior in the second thread, and after completion of the behavior in the second thread, executing the pair of the end (x) and the join (x), by executing the end (x) in the second thread and the join (x) in the first thread, wherein the execution of the join (x) restarts execution of the first thread to be able to further execute other behaviors in the first thread.

2. The method according to claim 1, wherein the executing of the move command comprises:
    executing basic move commands for performing basic movements.

3. The method according to claim 2, wherein the executing comprises:
combining the basic move commands to define a desired move command;
interpreting the defined desired move command; and
executing the basic move commands in accordance with the interpretation result.

4. The method according to claim 2, wherein the basic move commands comprise an execution order move command group for moving the specification in association with the execution order of execution units in the structure of the specification and a communication channel move command for moving the specification in association with a communication channel between execution units in the structure of the specification.

5. The method according to claim 4, wherein
the communication channel move command comprises a command group for moving the communication channel to upper level or lower level in the hierarchical structure of the specification,
the execution order move command comprises a command group for moving the execution unit to upper level or lower level in the hierarchical structure of the specification.

6. The method according to claim 1, wherein the specification is described such that:
execution units and a communication channel for communication between the execution units are described as elements;
an overall control specification is described by a hierarchical combination of control structures using at least sequential execution, parallel execution, interrupt execution, and repetitive execution; and
a flow of data is described by coupling the execution units through the communication channel.

7. The method according to claim 6, wherein the specification comprises a description relating to the exchange of events parallelly executed between not less than two execution units and the specification comprises a description relating to a synchronization processing.

8. A computer readable storage medium storing instructions of a computer program which when executed by a computer results in performance of operations comprising:
storing a structure of the specification described in a system description language in a storage unit, the specification being composed of a plurality of behaviors;
storing constraint information indicating a set of first execution order constraints each represented by an order relation of behaviors and associated with the specification in the storage unit;
converting the specification to another specification having a set of second execution order constraints equivalent to the set of first execution order constraints or having a set of third execution order constraints stronger than the set of first execution order constraints by referring to the constraint information of the storage unit; and
moving contents of a predetermined portion of the specification in the structure of the specification to another portion in the structure thereof to change the structure of the specification while the contents of the specification are maintained, by subjecting the specification to synchronization processing using a pair of start (x) and fork (x) and a pair of end (x) and join (x) (x represents an ID number), the pair of the start (x) and fork (x) having identical ID numbers being synchronously executed, and the pair of the end (x) and join (x) having identical ID numbers being synchronously executed, in communications to execute sequentially the behaviors of the specification according to an execution order, the moving including:
determining whether or not contents of the predetermined portion in the structure of the specification are able to be moved based on a movability determination rule;
displaying destination candidates on a display device when the moving is able to be performed;
specifying one destination referring to the displayed destination candidates;
calculating the another portion in the structure based on a movability portion calculation rule in response to the specifying of the one destination;
correcting part of the specification to perform the movement based on a specification correction rule; and
moving the contents of the predetermined portion to said another portion by:
executing the pair of the fork (x) and the start (x), by executing the fork (x) in the first thread, wherein executing the fork (x) halts execution of the first thread and moves execution of a behavior in the first thread to a second thread, and executing the start (x) in a second thread,
executing the behavior in the second thread, and after completion of the behavior in the second thread, executing the pair of the end (x) and the join (x), by executing the end (x) in the second thread and the join (x) in the first thread, wherein the execution of the join (x) restarts execution of the first thread to be able to further execute other behaviors in the first thread.

9. The computer readable storage medium according to claim 8, wherein the specifying the one destination comprises:
receiving an instruction to select at least one of the plurality of candidates.

10. The computer readable storage medium according to claim 8, wherein the executing the move command comprises:
executing basic move commands for performing basic movements.

11. The computer readable storage medium according to claim 10, wherein the executing the move command comprises:
combining the basic move commands to define a desired move command;
interpreting the defined desired move command; and
executing the basic move commands in accordance with the interpretation result.

12. The computer readable storage medium according to claim 10, wherein the basic move commands comprise at least an execution order move command group for moving the specification in association with the execution order of execution units in the structure of the specification and a communication channel move command for moving the specification in association with a communication channel between execution units in the structure of the specification.

13. The computer readable storage medium according to claim 12, wherein
the communication channel move command comprises a command group for moving the communication channel to an upper level or lower level in the hierarchical structure of the specification,
the execution order move command comprises a command group for moving the execution unit to the upper level or lower level in the hierarchical structure of the specification.

14. The computer readable storage medium according to claim 8, wherein the specification is described such that:
- execution units and a communication channel for communication between the execution units are described as elements;
- an overall control specification is described by a hierarchical combination of control structures using at least sequential execution, parallel execution, interrupt execution, and repetitive execution; and
- a flow of data is described by coupling the execution units through the communication channel.

15. The computer readable storage medium according to claim 14, wherein the specification comprises a description relating to an exchange of events executed in parallel between not less than two execution units and the specification comprises a description relating to a synchronization processing.

* * * * *